(12) United States Patent
Hayashi et al.

(10) Patent No.: US 7,888,262 B2
(45) Date of Patent: Feb. 15, 2011

(54) SEMICONDUCTOR DEVICE AND MANUFACTURING METHOD OF SEMICONDUCTOR DEVICE

(75) Inventors: Yumi Hayashi, Kanagawa-ken (JP); Tadayoshi Watanabe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 11/955,880

(22) Filed: Dec. 13, 2007

(65) Prior Publication Data

US 2008/0142989 A1 Jun. 19, 2008

(30) Foreign Application Priority Data

Dec. 13, 2006 (JP) ............................. 2006-335722

(51) Int. Cl.
*H01L 21/4763* (2006.01)
(52) U.S. Cl. .................. 438/637; 438/622; 438/638; 438/639; 438/640; 257/774; 257/E23.145
(58) Field of Classification Search ............... 257/774, 257/E23.144, E21.495; 438/637, 619
See application file for complete search history.

(56) References Cited

U.S. PATENT DOCUMENTS 6,064,118 A 5/2000 Sasaki 6,376,357 B1 * 4/2002 Onuma ..................... 438/619
2007/0241319 A1 * 10/2007 Chang ........................ 257/3

FOREIGN PATENT DOCUMENTS

| JP | 10-294316 | 11/1998 |
|----|-----------|---------|
| JP | 2000-208621 | 7/2000 |
| JP | 3526289 | 2/2004 |

OTHER PUBLICATIONS jp2000-208621.*

* cited by examiner

*Primary Examiner*—N Drew Richards
*Assistant Examiner*—Mamadou Diallo
(74) *Attorney, Agent, or Firm*—Oblon, Spivak, McClelland, Maier & Neustadt, L.L.P.

(57) ABSTRACT

In one aspect of the present invention, A method for manufacturing a semiconductor device may include forming a first wiring in a first insulating layer on a base member, forming a second insulating layer on the first insulating layer, forming a first hole in the second insulating layer so as to reach the first wiring in the first insulating layer and a second hole in the second insulating layer so as to reach the first insulating layer, forming a via contact in the first hole, and forming a third insulating layer on the second insulating layer so as to shut the second hole.

11 Claims, 16 Drawing Sheets

US 7,888,262 B2

SEMICONDUCTOR DEVICE AND MANUFACTURING METHOD OF SEMICONDUCTOR DEVICE

CROSS REFERENCE TO RELATED APPLICATION

This application is based upon and claims the benefit of priority from Japanese Patent Application No. 2006-335722, filed on Dec. 13, 2006, the entire contents of which are incorporated herein by reference.

BACKGROUND

In recent years, there is a growing demand for a reduction in wiring capacities in order to achieve higher performance of multilayer wiring in large scale integrated circuits (LSIs). Here, to achieve the lowest wiring capacity, it is only necessary to form a hollow space between wires or a space between vias (an air gap, k=1.0). For example, the following technique is under study for forming such an air gap. First, wires are formed on a sacrificial film by a damascene method. Then the sacrificial film is removed. Thereafter, an insulating film having low step coverage is deposited so as to cover a gap between the wires. This method is indeed able to form an air gap between wires in a dense pattern because an upper part thereof is occluded before the gap is buried. However, if a large gap is formed by entirely removing the sacrificial film between wires in a sparse pattern, the insulating film is directly deposited in the location where the sacrificial film is removed. Accordingly, it is hardly possible to form an air gap.

Moreover, this conventional method has a problem if a position of a via hole formed on the wire is displaced when processing such a via hole. If the via hole is displaced and provided on an air gap formed in the lower layer, a via contact material is deposited also inside the air gap. This may cause an insulation failure between the wires. Such performance degradation is a critical issue in a dense pattern where lines and spaces are formed in a width dimensional ratio of 1:1. It is predicted that such misalignment will be a serious problem along with future refinement of multilayer wiring.

SUMMARY

Aspects of the invention relate to an improved semiconductor device and manufacturing method of semiconductor device.

In one aspect of the present invention, A method for manufacturing a semiconductor device may include forming a first wiring in a first insulating layer on a base member, forming a second insulating layer on the first insulating layer, forming a first hole in the second insulating layer so as to reach the first wiring in the first insulating layer and a second hole in the second insulating layer so as to reach the first insulating layer, forming a via contact in the first hole, and forming a third insulating layer on the second insulating layer so as to shut the second hole.

In another aspect of the invention, A semiconductor device may include a base body, a first insulating layer provided on the base member, a first wiring provided in the first insulating layer, a second insulating layer provided on the first insulating layer and having a first hole and second hole, the first hole being in contact with the first wiring and the second hole being in contact with the first insulating layer, a via contact provided in the first hole in second insulating layer and electrically connected to the first wiring and a third insulating layer provided on the second insulating layer so as to shut the second hole and a gas is provided in the second hole.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
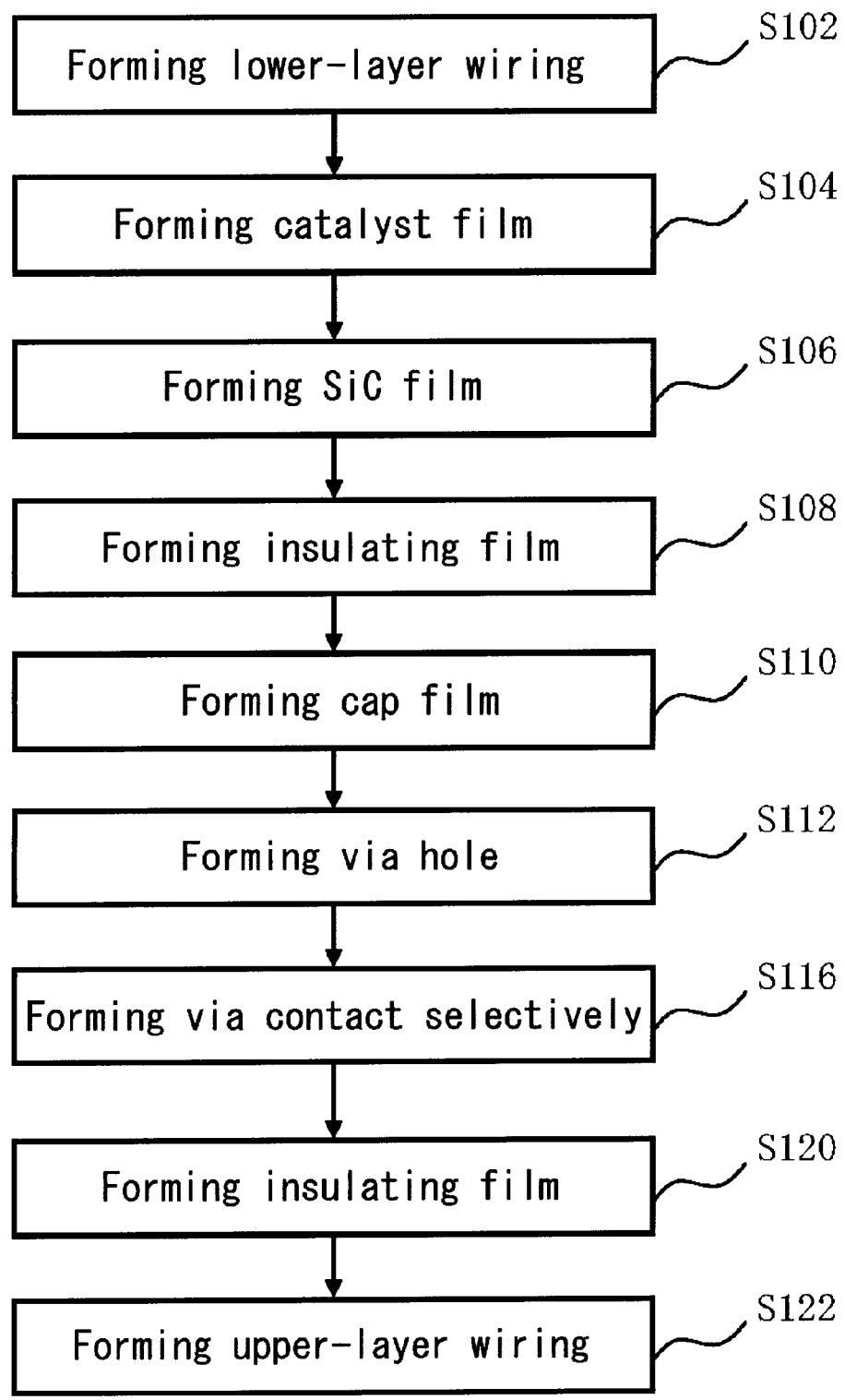
FIG. 1 is a flowchart showing a method of manufacturing a semiconductor device according to the first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

A first embodiment of the present invention will be explained hereinafter with reference to FIGS. 1-7.

In a first embodiment, multiple holes having the same dimension as a via hole are formed in positions other than a location supposed to be provided with a via contact simultaneously with the via hole by using lithography. Then, after forming the via contact, the remaining hollows are used as air gaps. Now, the first embodiment will be described below with reference to the accompanying drawings.

FIG. 1 is a flowchart showing a method of manufacturing a semiconductor device according to the first embodiment.

As shown in FIG. 1, the method of manufacturing a semiconductor device according to the first embodiment is configured to execute a series of processes including: forming lower-layer wiring (S102), forming catalyst film (S104), forming SiC film (S106), forming insulating film (S108), forming cap film (S110), forming via hole (S112), forming via contact selectively (S116), forming insulating film (S120), and forming upper-layer wiring (S122).

FIGS. 2A to 2D are process cross-sectional views showing the processes to be executed according to the flowchart in FIG. 1. FIGS. 2A to 2D show the processes from forming lower-layer wiring (S102) to forming insulating film (S108).

Figure 2A:
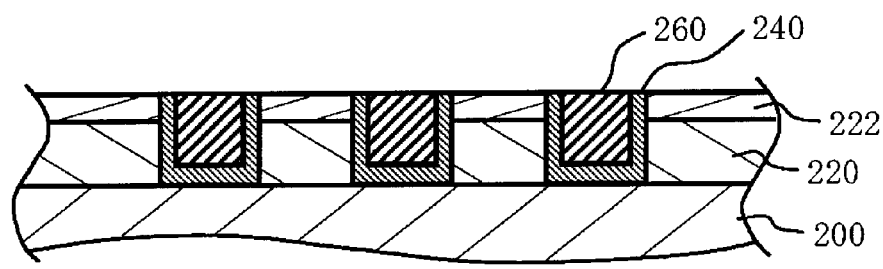
FIGS. 2A-2D are process cross-sectional views showing the processes to be executed according to the flowchart in FIG. 1.

As shown in FIG. 2A, Cu wiring made of a Cu film 260 is formed on a substrate (base member) 200 as the lower-layer wiring forming step. First, a thin insulating film 220 is formed in a thickness of 200 nm, for example, on the substrate 200 by use of porous insulating material having a low dielectric constant. By forming this insulating film 220, it is possible to obtain the interlayer insulating film having a relative permittivity k lower than 3.5. Here, for example, the insulating film 220 is formed by coating LKD (low-k dielectric material: made by JSR Corporation), which includes polymethylsiloxane as a low dielectric constant insulating material having a relative permittivity below 2.5. Instead of a film made of polymethylsiloxane, the insulating film 220 may be formed of at least one selected from the group consisting of: a film having a siloxane skeleton such as polysiloxane, hydrogen silsesquioxane or methylsilsesquioxane; an organic film mainly containing organic resin such as polyarylene ether (PAr), polybenzoxazole or polybenzocyclobutene; and a porous film such as a porous silica film. The above-mentioned materials of the insulating film 220 can achieve a low dielectric constant equivalent to a relative permittivity below 2.5. As for a forming method, it is possible to use the SOD (spin-on dielectric coating) method of forming a thin film by first spin-coating a solution and then thermally treating the thus applied layer, and the chemical vapor deposition (CVD) method, for example. Moreover, a thin silicon oxycarbide SiOC film 222 serving as a cap insulating film is formed on the insulating film 220 by depositing SiOC in a thickness of 200 nm by the CVD method, for example. By forming the SiOC film 222, it is possible to protect the insulating film 220 having a low mechanical strength against a load of chemical mechanical polishing (CMP) used in the course of burying the wiring material by the damascene method, and thereby to cause the insulating film 220 to have a structure with the Cu wiring embedded therein. In addition to SiOC, the cap insulating film may be formed of at least one insulating material having a relative permittivity equal to or above 2.5, that is, at least one insulating material selected from the group consisting of TEOS (tetraethoxysilane), SiC, silicon carbohydride (SiCH), silicon carbonitride (SiCN), SiOCH, and silane (SiH4). Although the film is formed by the CVD method herein, it is also possible to use other methods such as the SOD method.

Then, an opening serving as a wiring groove structure for fabricating the damascene wiring is formed in the SiOC film 222 and the insulating film 220 by way of a lithography process and a dry etching process. First, the lithography processes such as an unillustrated resist coating process and an exposure process are executed to form a resist film on the SiOC film 222 of the substrate 200. Then the uncoated SiOC film 222 and the insulating film 220 under the SiOC film 222 are removed by the anisotropic etching method to form the opening. By using an anisotropic etching method, it is possible to form the opening almost perpendicularly to a surface of the substrate 200. For example, the opening may be formed by the reactive ion etching method. Thereafter, barrier metal film 240 is formed on surfaces of the opening serving as a groove for the lower-layer wiring and of the SiOC film 222 by use of a barrier metal material. The barrier metal film 240 is formed by depositing a thin tantalum (Ta) film in a thickness of 15 nm, for example, in a sputtering apparatus employing the sputtering method, which is one type of the physical vapor deposition (PVD) method. The method of depositing the barrier metal material is not limited only to the PVD method. Here, it is also possible to use the atomic layer vapor deposition (the atomic layer deposition (ALD) method or the atomic layer chemical vapor deposition (ALCVD) method), or the CVD method, for example. These methods can improve coverage as compared to the PVD method. Meanwhile, in addition to Ta, the barrier metal film may be formed of other materials including tantalum nitride (TaN), titanium (Ti), tungsten (W), titanium nitride (TiN), tungsten nitride (WN), or may be a layered film using a combination of these, such as the combination of Ta and TaN.

Then, a first thin Cu film to be used as a cathode in a subsequent electroplating process is deposited (formed) as a seed film on the barrier metal film 240 formed on the inner walls of the opening and the surface of the substrate. Here, the seed film is deposited in a thickness of 50 nm, for example. Thereafter, a second thin Cu film 260 is deposited on the surfaces of the opening and the substrate by an electrochemical growth method such as electrolytic plating while using the seed film as a cathode. After deposition, an annealing process is executed for 30 minutes at 250 Centigrade, for example. Then, the surface of the substrate 200 is polished by the CMP method so as to polish and remove an excessive portion, which is deposited on the surface of the SiOC film 222 besides the opening, of the barrier metal film 240 and the Cu film 260 including the seed film. In this way, the surface of the substrate becomes even, and the structure with the Cu wiring 260 serving as the lower-layer wiring embedded therein is formed as shown in FIG. 2A.

Here, a silicon wafer having a diameter of 300 mm is used as the substrate 200, for example. Note that illustration of device sections is omitted herein. In the substrate 200, it is also possible to form layers constituting various semiconductor elements and structures unillustrated herein, such as metal wiring or contact plugs. It is also possible to form other layers therein.

Figure 2B:
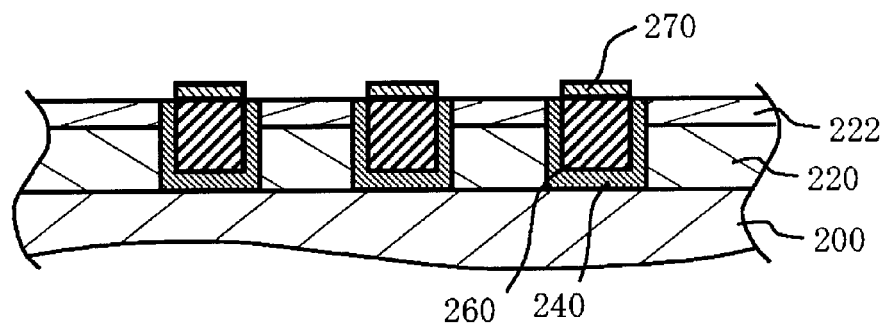

As shown in FIG. 2B, a cobalt (Co) film 270 functioning as a catalyst for growing a carbon nanotube (CNT) film to be described later is formed in the catalyst film forming step. The Co film 270 may be selectively formed, by means of a selective plating method, on the Cu film 260 whose surface is exposed as a result of polishing by the CMP method. It is also preferable to use other materials such as nickel (Ni) as the material of the catalyst layer.

Figure 2C:
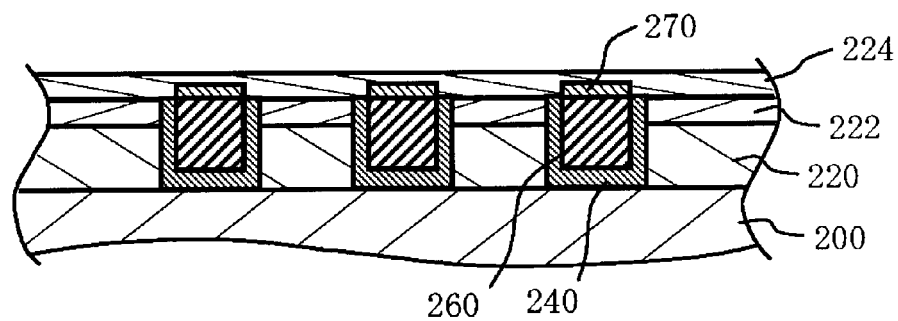

As shown in FIG. 2C, a SiC film 224 is formed on the exposed surfaces of the SiOC film 222, the barrier metal film 240, and the Co film 270 as the SiC film forming step (a stopper film forming step). As for a forming method, it is possible to use the CVD method, for example. It is also possible to use other materials such as SiCN or SiN and other methods. Then, the SiC film 224 can be used as an etching stopper for forming via holes to be described later. If an etching amount is controllable by adjusting etching time and the like, then it is not necessary to form the SiC film 224.

Figure 2D:
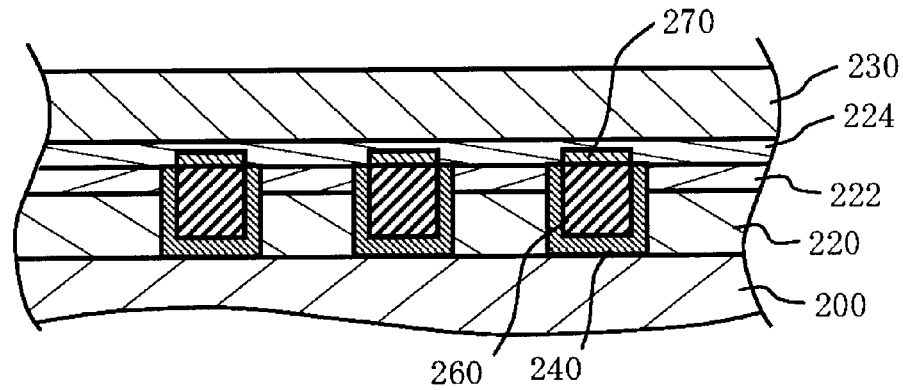

As shown in FIG. 2D, an insulating film 230 constituting an interlayer insulating film for a via layer is formed on the SiC film 224 as the insulating film forming step. Here, the insulating film 230 is formed by use of the same material as that of the interlayer insulating film for the lower-layer wiring layer. The material of the insulating film 230 is preferably a porous insulating material having a low dielectric constant. By forming this insulating film 230, it is possible to obtain the interlayer insulating film having a relative permittivity k lower than 3.5. Here, instead of a film made of polymethylsiloxane, the insulating film 230 may be formed of at least one selected from the group consisting of: a film having a siloxane skeleton such as polysiloxane, hydrogen silsesquioxane or methylsilsesquioxane; an organic film mainly containing organic resin such as polyarylene ether (PAr), polybenzoxazole or polybenzocyclobutene; and a porous film such as a porous silica film as similar to the lower-layer wiring layer.

Figure 3A:
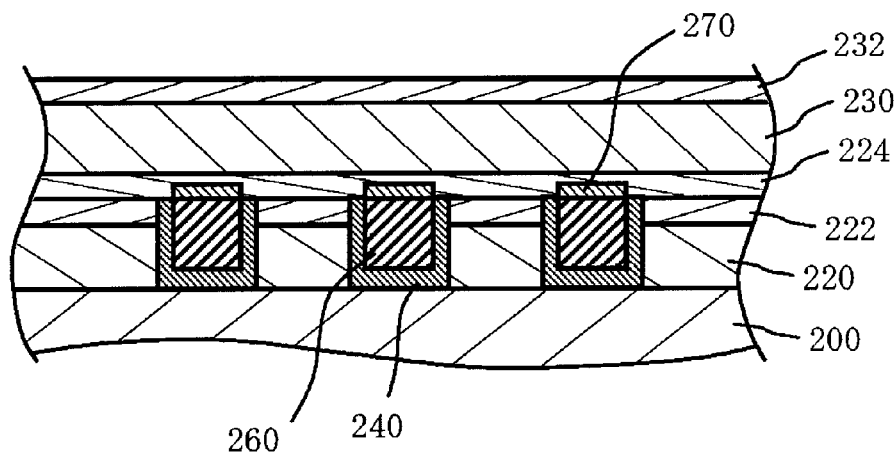
FIGS. 3A-3C are process cross-sectional views showing the processes to be executed according to the flowchart in FIG. 1.
Figure 3B:
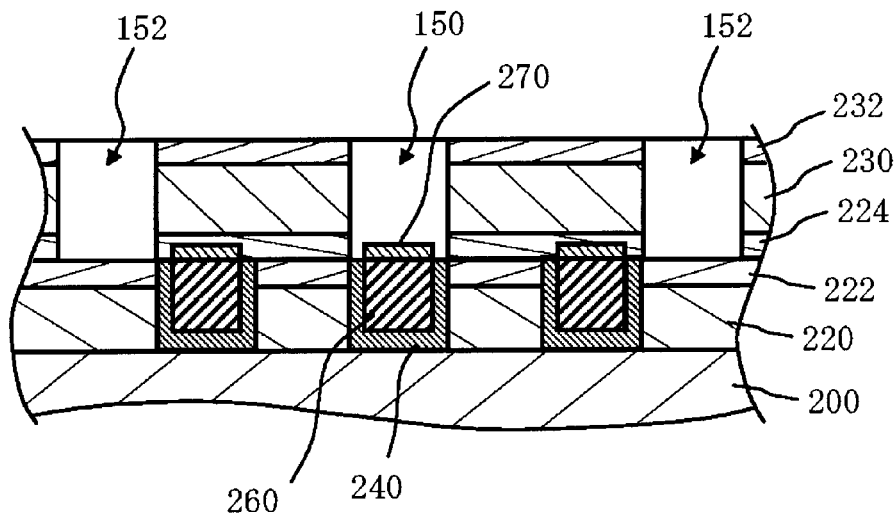
Figure 3C:
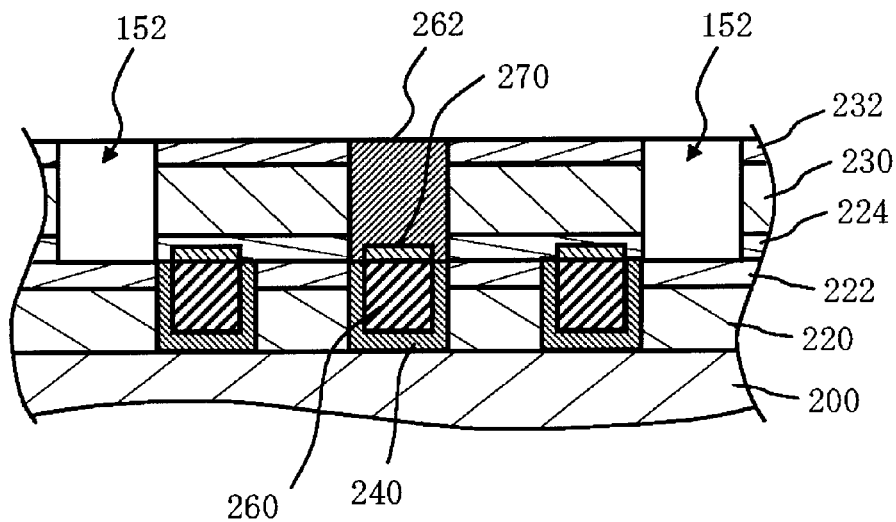

FIGS. 3A to 3C are process cross-sectional views showing the processes to be executed according to the flowchart in FIG. 1.

FIGS. 3A to 3C show the processes from forming cap film (S110) to forming via contact selectively (S116).

As shown in FIG. 3A, a thin SiOC film 232 serving as a cap insulating film is formed on the insulating film 230 by depositing SiOC by the CVD method, for example, as the cap film forming step. In addition to SiOC, the cap insulating film may be formed of at least one insulating material having a relative permittivity equal to or above 2.5, that is, at least one insulating material selected from the group consisting of TEOS (tetraethoxysilane), SiC, silicon carbohydride (SiCH), silicon carbonitride (SiCN), SiOCH, $SiO_2$, and silane ($SiH_4$). Although the film is formed by the CVD method herein, it is also possible to use other methods instead. Moreover, when there is no problem in light of executing the lithography directly on the insulating film 230 or when the insulating film 230 has an adequate strength and satisfies other requirements, it is possible to omit formation of the cap insulating film 232.

As shown in FIG. 3B, multiple holes 150 and 152 that penetrate from the SiOC film 232 serving as the cap film to an upper surface of the lower-layer wiring layer are formed by lithography and etching processes as the via hole opening step. First, an opening is provided with the SiC film 224 as an etching stopper and then the SiC film 224 is etched until reaching the lower-layer wiring layer. Here, in addition to the hole 150 for forming a via contact, the holes 152 are also formed in positions not supposed to form any via contacts. The hole 150 is provided on the Cu wiring 260, and the hole 152 is provided on the insulating film 222. It is preferable to set the diameters of those holes 152 substantially equal to the diameter of the hole 150. For example, it is preferable to set equal to the minimum line width of a pattern formable by the lithography. Moreover, it is preferable to form the holes 152 in the same shape to each other. It is preferable to form the holes 152 in the same shape because a capacity can be controlled by the number of the holes 152. The shape of the holes 152 constituting air gaps may be either circular or ellipsoidal. It is desirable to employ an appropriate shape depending on a wiring pattern so as to minimize the capacity thereof. It is possible to reduce the capacity effectively by increasing either the number of the holes 152 or the cross-sectional area of the holes 152. However, if the diameter of the holes 152 is too large, then the holes 152 may be buried in the course of forming an insulating film thereabove. Therefore, it is preferable to change the diameter depending on the wiring pattern.

Figure 4:
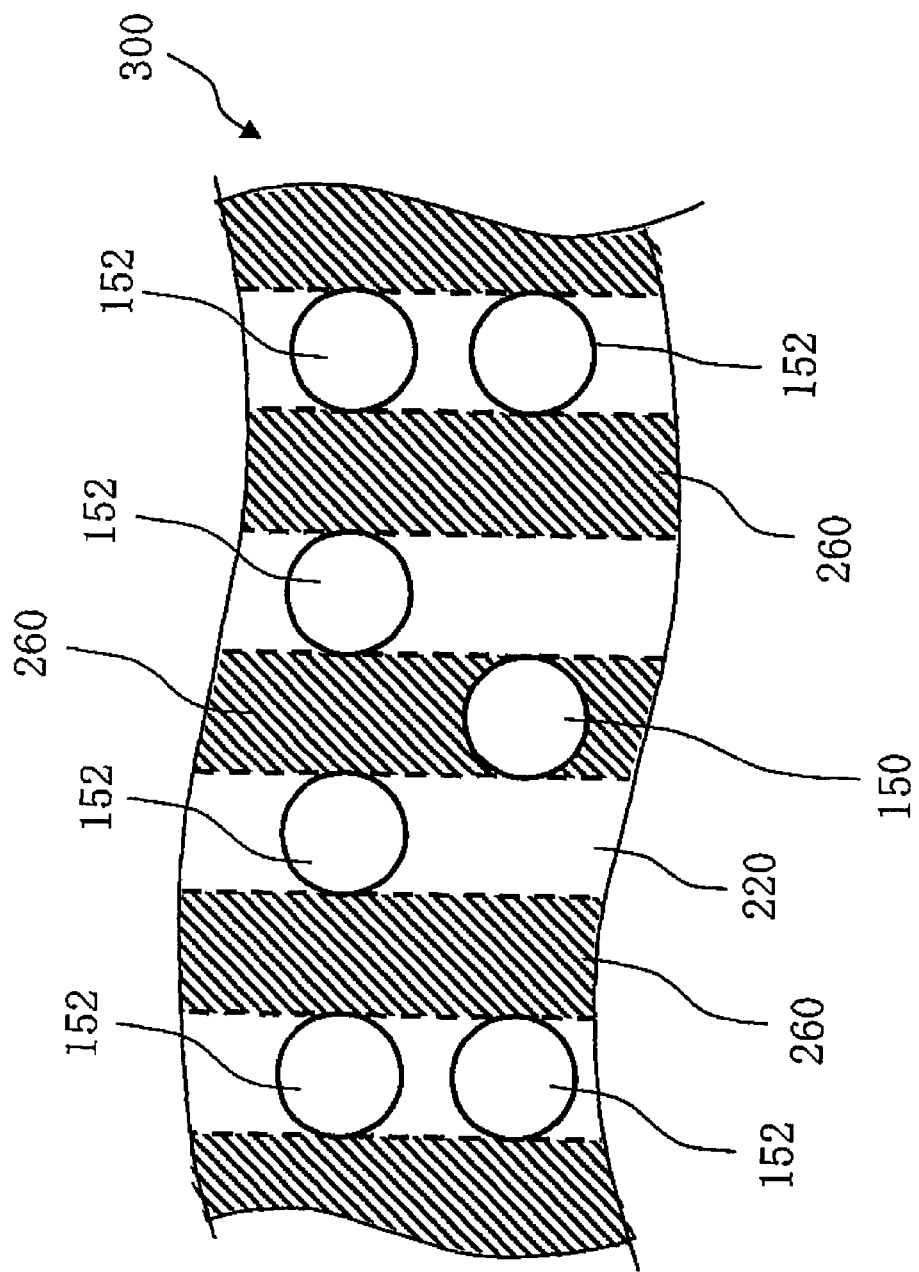
FIG. 4 is a top plan view showing an example of the positions for forming the holes.

FIG. 4 is a top plan view showing an example of the positions for forming the holes.

FIG. 4 shows the example of the positions to be opened in a dense pattern region 300 having a line-and-space ratio of 1:1. In the dense pattern region 300, the Cu film 260 constituting the lower-layer wiring and the insulating film 220 constituting the insulating film between the wires are alternately formed at width dimension intervals of 1:1. In this case, it is preferable to form the holes 152 on the insulating film 220 that constitute space regions. However, the holes 152 are formed in positions while avoiding any positions that may cause contact between the holes 152 constituting the air gaps and the hole 150 serving as the via. If the holes contact each other, the holes may be connected to each other and a via contact may be formed inside the hole 152 opened for the air gap. Accordingly, this problem can be prevented by avoiding such a contact. Moreover, if the holes contact each other, a material of an upper layer may be deposited inside the holes 152 when forming the upper layer. For this reason, it is possible to avoid this problem by preventing the contact. Meanwhile, the holes 152 are opened so as not be located immediately below upper-layer wiring. In this way, it is possible to prevent deposition of the material of the upper-layer wiring that may occur in the case of forming the holes 152 to be located partially below the upper-layer wiring. As a result, it is possible to prevent a short circuit between the wires. Moreover, a dummy wiring may be provided on the lower-layer wiring. If the holes 152 are formed on the dummy wiring, a material of via contacts grows inside the holes 152 and may cause a problem such as a short circuit. Therefore, if a dummy wiring is provided on the wiring layer, the holes 152 constituting the air gaps are not formed on the dummy wiring.

Figure 5:
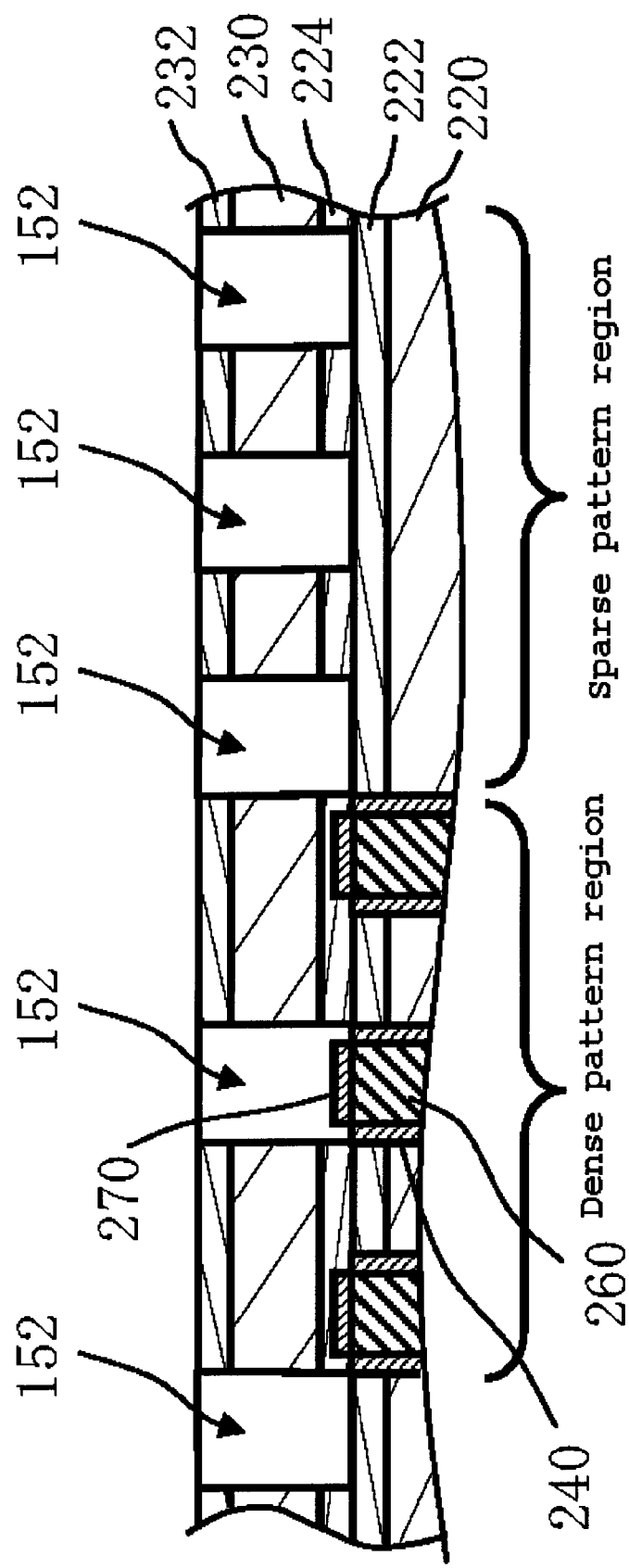
FIG. 5 is a cross-sectional view showing another example of locations for forming the holes.

FIG. 5 is a cross-sectional view showing another example of locations for forming the holes.

As shown in FIG. 5, it is preferable to open the holes 152 in the case of a sparse pattern similarly to the dense pattern. In this way, it is possible to open the holes 152 in the appropriate size for covering the holes 152 with another insulating film to be described later by opening the holes 152 using the lithography irrespective of the pattern density. Accordingly, it is possible to open the holes 152 for the air gaps effectively. Moreover, by patterning the holes 152 by the lithography, it is possible to control the shapes of the holes 152. Therefore, it is possible to form the uniform air gaps. Hence it is possible to control a capacity value by regulating the positions and the number of the holes 152 formed thereon.

As shown in FIG. 3C, in the selective via contact forming step, a via contact film 262 is selectively formed in the hole 150 located on the lower-layer wiring out of the multiple holes 150 and 152 formed as above. Here, carbon nanotubes (CNT) are formed as the via contact film 262 selectively on the Cu film 260, for example. It is possible to grow the carbon nanotubes by heating the substrate up to a temperature in a range from 400 to 500 Centigrade inside a chamber to which a gas containing carbon (C) is supplied, for example. In this case, the carbon nanotubes grow on the Co film 270 as the Co film 270 acts as the catalyst. Accordingly, it is possible to form the carbon nanotubes selectively on the Co film 270 acting as the catalyst. Meanwhile, an acetylene ($C_2H_2$) gas can be used as the supplied gas. Here, as the Co film 270 is formed on a bottom surface of the hole 150, it is possible to allow the carbon nanotubes to grow inside the hole 150 and thereby to fill the hole 150. Meanwhile, the Co film is not formed on bottom surfaces of the holes 152 so that no carbon nanotubes grow inside. In this way, it is possible to form the via contact film 262 selectively.

In the above-described example, the Co film 270 is formed before opening the holes 150 and 152. However, the present invention is not limited only to this configuration. It is also possible to form the Co film 270 after opening the holes 150 and 152. In this case, it is also possible to form the Co film 270 selectively on the Cu film 260 being a metal film by use of the selective plating method.

Further, in addition to the carbon nanotubes, it is also preferable to use Co, Ni, Cu, and the like as the material of the via contact film 262. In the case of the metal film using any of the above materials, it is possible to form the via contact film 262 selectively on the Cu film 260 constituting the lower-layer wiring by use of the selective plating method. Therefore, it is possible to form the via contact film 262 selectively in the hole 150 located on the lower-layer wiring. Moreover, when using any of these metal films as the via contact film 262, it is not necessary to provide the Co film 270 serving as the catalyst.

Figure 6A:
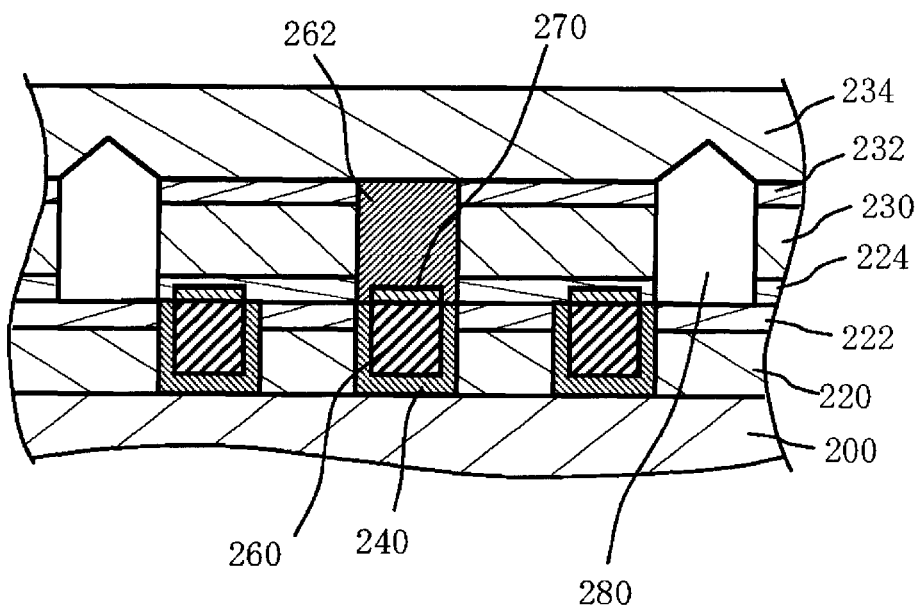
FIGS. 6A and 6B are process cross-sectional views showing the processes to be executed according to the flowchart in FIG. 1.
Figure 6B:
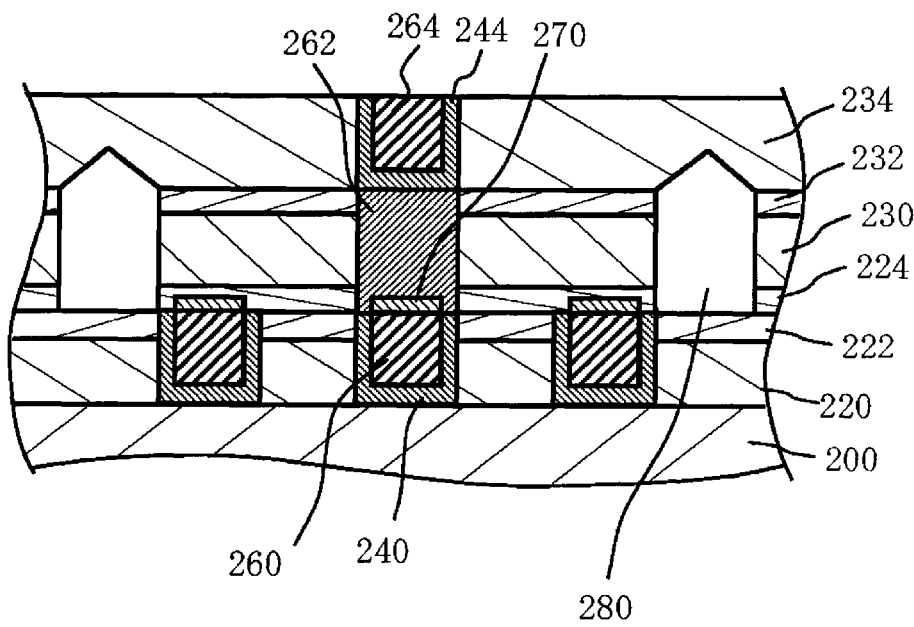

FIGS. 6A and 6B are process cross-sectional views showing the processes to be executed according to the flowchart in FIG. 1.

FIGS. 6A and 6B show the processes from forming insulating film (S120) to forming upper-layer wiring (S122).

As shown in FIG. 6A, in the insulating film forming step (S120), an insulating film 234 (a second insulating material film) is formed by use of the CVD method after forming the via contact film 262. By using the CVD method, it is possible to form the insulating film 234 so as to cover the remaining holes in which the via contact film 262 is not formed. In this way, it is possible to form air gaps 280 by closing (shutting) the tops of the holes 152. Here, the insulating film 234 is formed by use of the same material of the interlayer insulating film of the lower-layer wiring layer. The material of the insulating film 230 is preferably a porous insulating material having a low dielectric constant. Here, instead of a film made of polymethylsiloxane, the insulating film 234 may be formed of at least one selected from the group consisting of: a film having the siloxane skeleton such as polysiloxane, hydrogen silsesquioxane or methylsilsesquioxane; an organic film mainly containing organic resin such as polyarylene ether (PAr), polybenzoxazole or polybenzocyclobutene; and a porous film such as a porous silica film as similar to the lower-layer wiring layer. By forming this insulating film 234, it is possible to obtain the interlayer insulating film having a relative permittivity k lower than 3.5.

As shown in FIG. 6B, in the upper-layer wiring forming step, it is possible to form a Cu film 264 on the insulating film 234 by use of the damascene method similarly to the lower-layer wiring. Here, a barrier metal film 244 is formed on wall surfaces and a bottom surface of the Cu film 264. In this way, the upper-layer wiring is formed by use of the Cu film 264.

The following advantages are obtained by forming the air gap structure as described above. An advantage may be that it is possible to form the air gaps effectively in a portion with sparse wiring, which was unable by use of the conventional method, because the holes constituting the air gaps are formed by the lithography. Another advantage may be that it is possible to control the positions for forming the air gaps because the holes constituting the air gaps are formed by the lithography. For this reason, it is possible to open the holes 152 in consideration of possible misalignment that may occur when forming the upper-layer wiring. Accordingly, it is possible to avoid defects incurred by the contact between the air gaps and grooves constituting the upper-layer wiring. Another advantage may be that it is possible to reduce the capacity effectively without increasing the number of costly lithographic operations because the lithographic process for the air gaps and the lithographic process for the vias take place at the same time.

Figure 7:
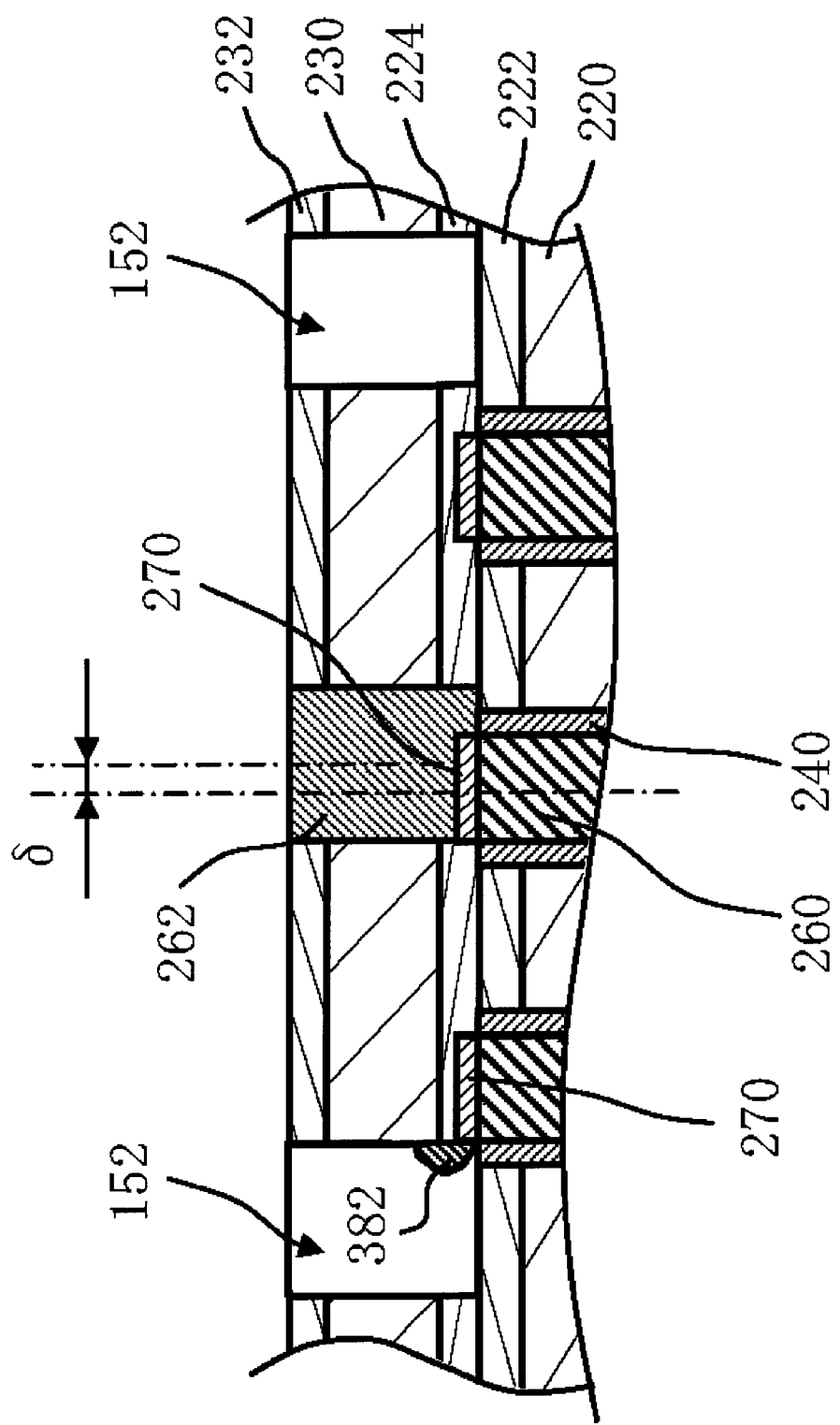
FIG. 7 is a cross-sectional view showing an example of misalignment occurred in the first embodiment.

FIG. 7 is a cross-sectional view showing an example of misalignment occurred in the first embodiment.

As shown in FIG. 7, if the position of the hole 150 for forming the via contact is displaced by a dimension (distance) 6, either the carbon nanotubes or the metal deposited by the selective plating method serving as the via contact film 262 grow only at the portion where the metal wiring is provided below. Meanwhile, the holes 152 for the air gaps are also displaced because the holes are formed by the light exposure together with the hole 150 for forming the via contact. As a result, the Cu film 260 constituting the lower-layer wiring may be partially uncovered. However, if the Cu film 206 is partially uncovered, the uncovered area is limited. Accordingly, when the hole 150 is completely buried with the via contact film growing therein, the material of the via contact does not grow very much and only a small conductive film 382 is formed inside the hole 152 as shown in FIG. 7. Moreover, the conductive film 382 is formed on the via layer but not in the wiring layer. Therefore, an interval between the via contacts is much longer than an interval between the lower-layer wiring. Accordingly, an insulation failure can hardly happen even in the case of displacement. Such an allowance for misalignment is effective for refining the multilayer wiring. In addition, there is also a concern that an isolated via formed in a low via density area may suffer from a shrinkage of a via diameter so that the via hole may be incompletely opened. However, if it is possible to avoid a defect attributable to misalignment, then it is possible to form such a via in a larger size. Accordingly, it is possible to avoid the concern of the incompletely opened via. Alternatively, it is possible to increase the pattern density by providing the holes 152 for the air gaps around the isolated via. In this way, it is possible to avoid the concern of the incompletely opened via.

Second Embodiment

A second embodiment is explained with reference to FIGS. 8-10.

A method of providing more air gaps in addition to the holes 152 will be described in a second embodiment.

Figure 8:
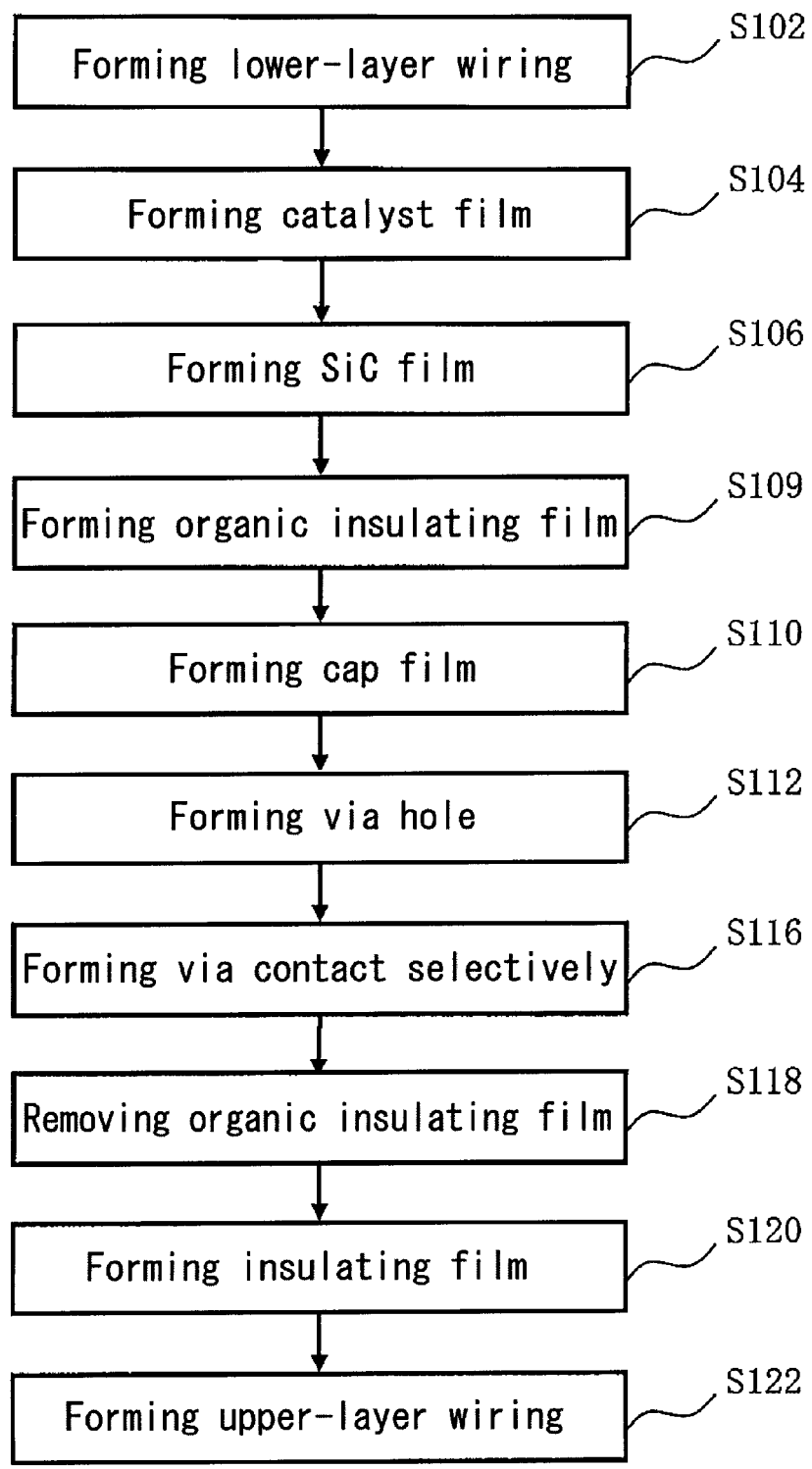
FIG. 8 is a flowchart showing a method of manufacturing a semiconductor device according to the second embodiment.

FIG. 8 is a flowchart showing a method of manufacturing a semiconductor device according to the second embodiment.

As shown in FIG. 8, the method of manufacturing a semiconductor device according to the second embodiment is similar to the method according to the first embodiment except that forming organic insulating film (S109) is executed instead of forming insulating film (S108) and that removing organic insulating film (S118) is inserted between the forming via contact selectively (S116) and the forming insulating film (S120). Accordingly, the processes from the forming lower-layer wiring (S102) to the forming SiC film (S106) are the same as the first embodiment.

In FIG. 2D, as the organic insulating film forming step, the insulating film 230 constituting the interlayer insulating film for the via layer is formed on the SiC film 224 as the organic insulating film forming step. Among the applicable materials cited in the first embodiment, an organic film such as PAr is used for the insulating film 230. Then, the processes from the cap film forming step (S110) to the selective via contact forming step (S116) are executed similarly to the first embodiment.

Figure 9A:
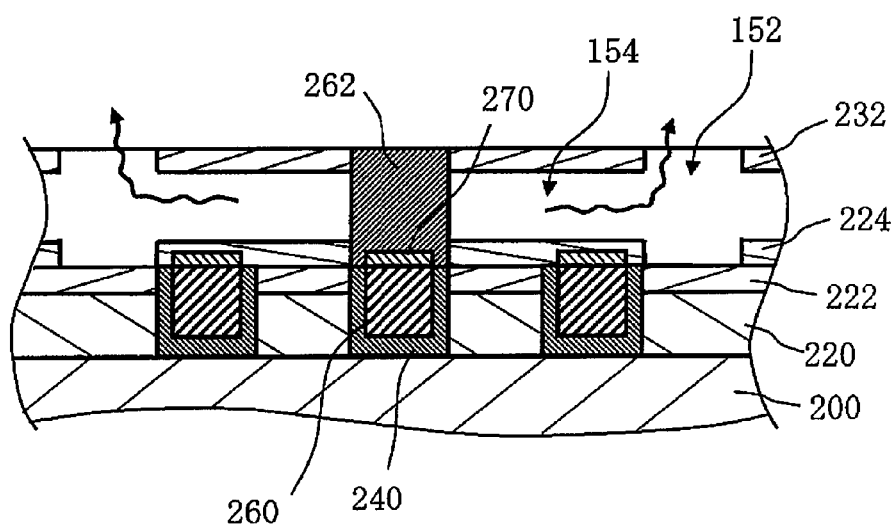
FIGS. 9A to 9C are process cross-sectional views showing the processes to be executed according to the flowchart in FIG. 8.
Figure 9B:
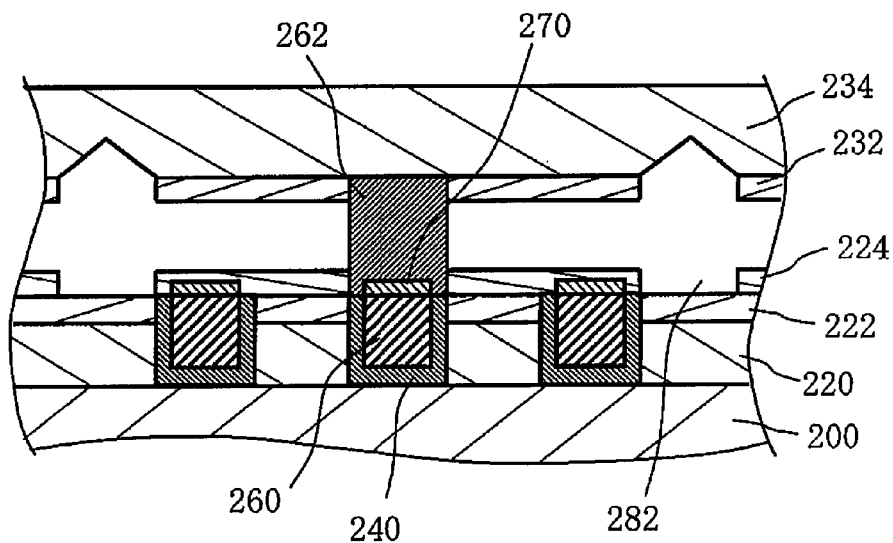
Figure 9C:
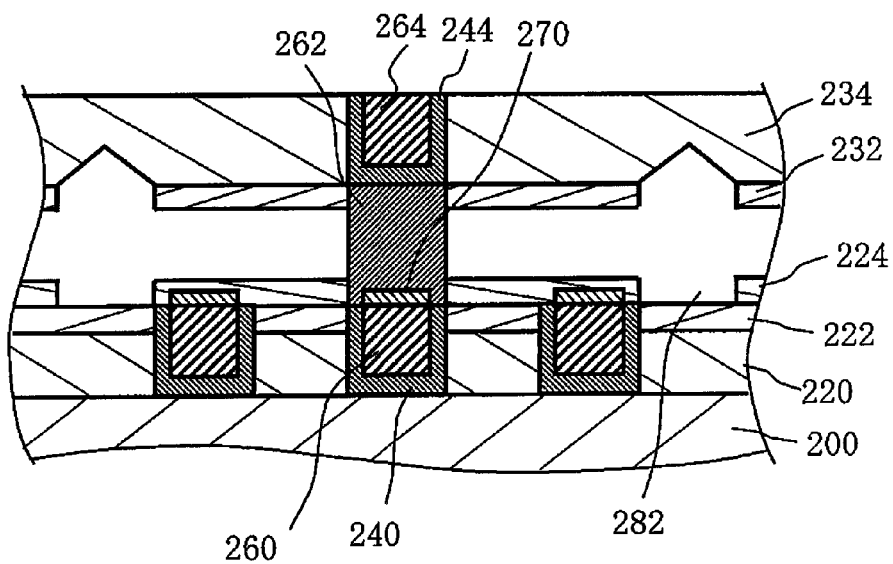

FIGS. 9A to 9C are process cross-sectional views showing the processes to be executed according to the flowchart in FIG. 8.

FIGS. 9A to 9C show the processes from the organic insulating film removing step (S118) to the upper-layer wiring layer forming step (S122).

As shown in FIG. 9A, in the organic insulating film removing step, the insulating film 230 is removed through the holes 152 by exposing the semiconductor device to an ammonia ($NH_3$) plasma atmosphere. In this way, a hollow space 154 is formed below the SiOC film 232 serving as the cap film. Here, it is also preferable to expose the semiconductor device to oxygen ($O_2$) plasma atmosphere or nitrogen/hydrogen ($N_2$/$H_2$) plasma instead of $NH_3$ plasma. Here it is only necessary to employ the atmosphere that can remove the insulating film 230 constituting a sacrificial film.

In the insulating film forming step, the insulating film 234 is formed by the CVD method similarly to the first embodiment. In this way, it is possible to close (shut) the tops of the holes 152 so as to cover the holes 152. As a result, it is possible to form a wider air gap 282 as shown in FIG. 9B in comparison with the first embodiment. Then, by forming the upper-layer wiring similarly to the first embodiment, it is possible to form a multilayer wiring structure including the Cu film 264 as an upper-layer wiring as shown in FIG. 9C. Here, the barrier metal film 244 is formed on the wall surfaces and the bottom surface of the Cu film 264.

In the second embodiment, the SiOC film 232 is connected to and supported by the wiring sideways by means of forming the SiOC film 232 (a third insulating material) constituting the cap film. Therefore, the SiOC film 232 functions as a protective film and maintains a mechanical strength even the space is provided below the SiOC film 232. Meanwhile, in addition to SiOC, it is also possible to use at least one insulating material selected from the group consisting of SiC, SiCH, SiCN, SiOCH, and $SiO_2$ as the material of the cap film. Moreover, it is also possible to use other films as long as such films are not removed by plasma. Moreover, instead of an insulating film formed by the CVD method, it is also possible to use an insulating film formed by a coating method as long as such a film is not removed by plasma. For example, it is possible to use polymethylsiloxane or the like. Moreover, the SiOC film 232 is supported by the via contact film 262 when the insulating film 230 between the via contacts is entirely removed. For this reason, it is preferable to arrange the positions to open the holes 152 so that the via contact film 262 can support the SiOC film 232. It is also preferable to reduce the number of the holes 152 as compared to the first embodiment in order to maintain the mechanical strength of the SiOC film 232. The number and the positions of the holes 152 can be appropriately determined so that the entire insulating film 230 is removable.

Figure 10:
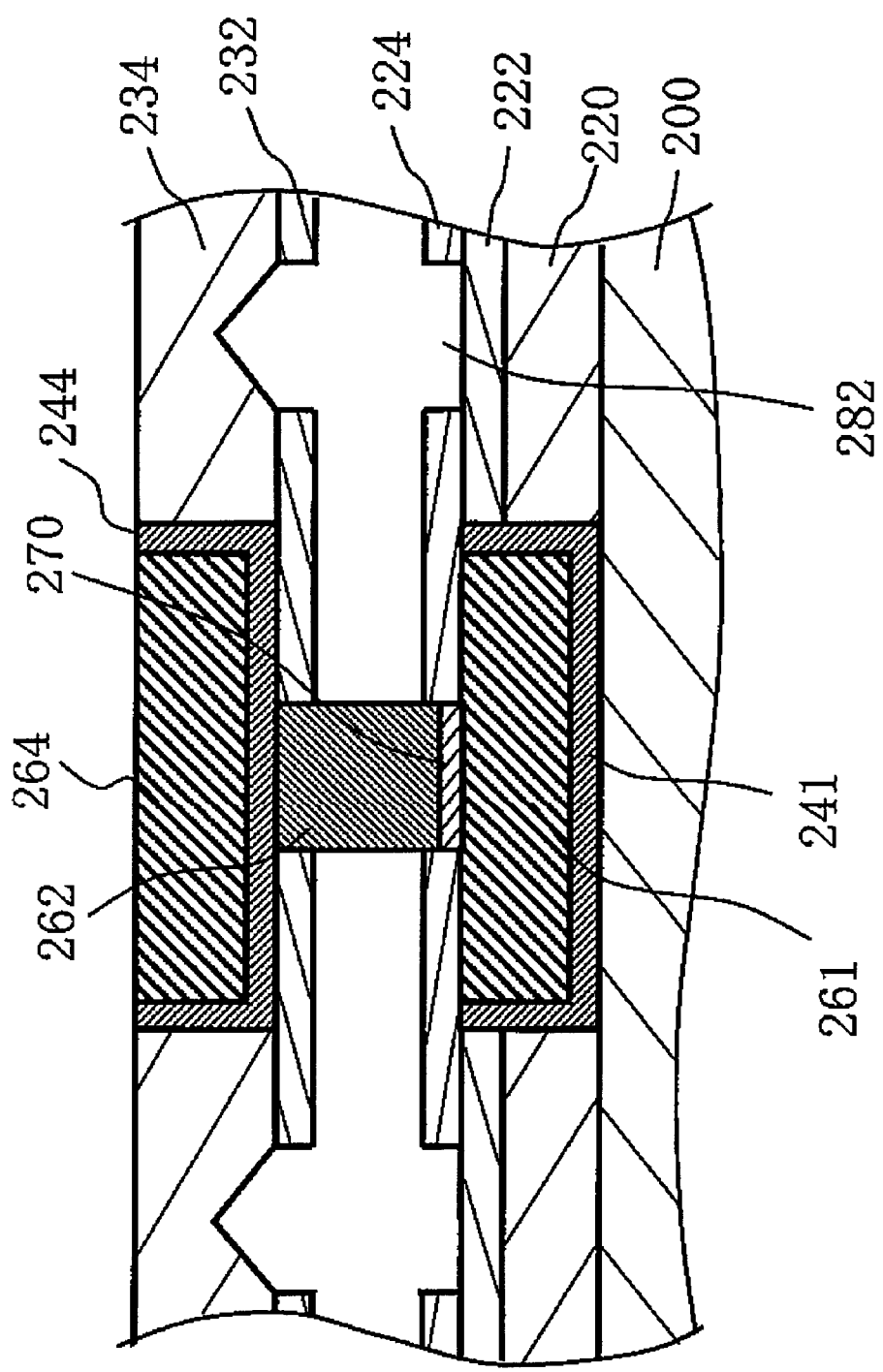
FIG. 10 is a view showing an example of the air gap structure in the case of large width wiring.

FIG. 10 is a view showing an example of the air gap structure in the case of large width wiring.

If the holes 152 are directly converted into the air gaps as in the first embodiment, the region below the wiring cannot be formed into the air gaps. However, by removing the entire insulating film 230 as described in the second embodiment, it is possible to form the air gap 282 as shown in FIG. 10 even below the large width wiring, where the Cu film 264 has a larger line width than the diameter of the via contact.

As described above, it is possible to further reduce the wiring capacity by removing the entire insulating film 230 on the via layer.

Third Embodiment

A third embodiment is explained with reference to FIGS. 11-14.

A structure for causing the air gap to further extend to the lower-layer wiring will be described in a third embodiment.

Figure 11:
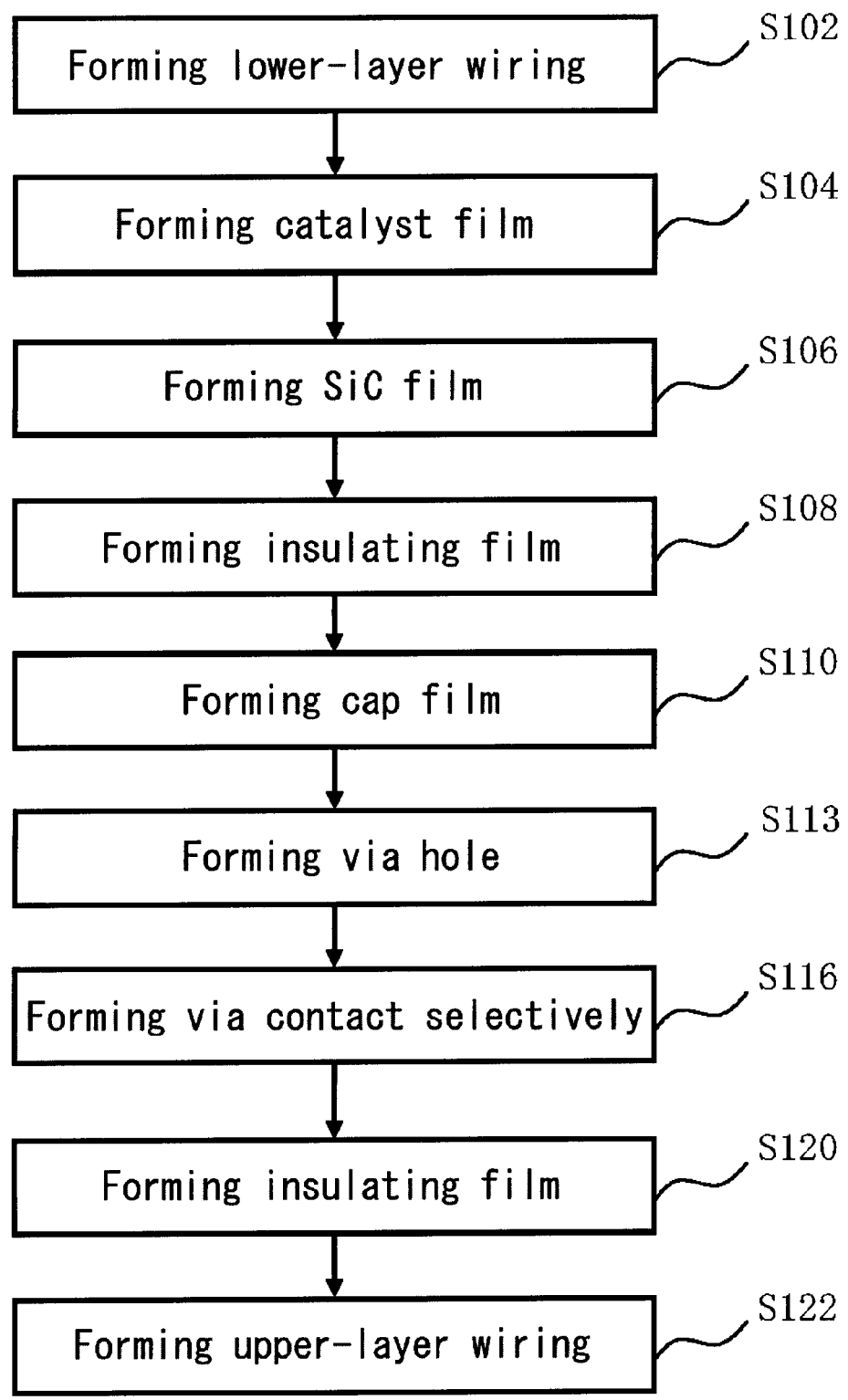
FIG. 11 is a flowchart showing a method of manufacturing a semiconductor device according to the third embodiment.

FIG. 11 is a flowchart showing a method of manufacturing a semiconductor device according to the third embodiment.

As shown in FIG. 11, the method of manufacturing a semiconductor device according to the third embodiment is similar to FIG. 1 except that forming via hole (S113) is executed instead of the forming via hole (S112). Accordingly, the processes from the forming lower-layer wiring (S102) to the forming cap film (S110) are the same as the first embodiment.

Figure 12A:
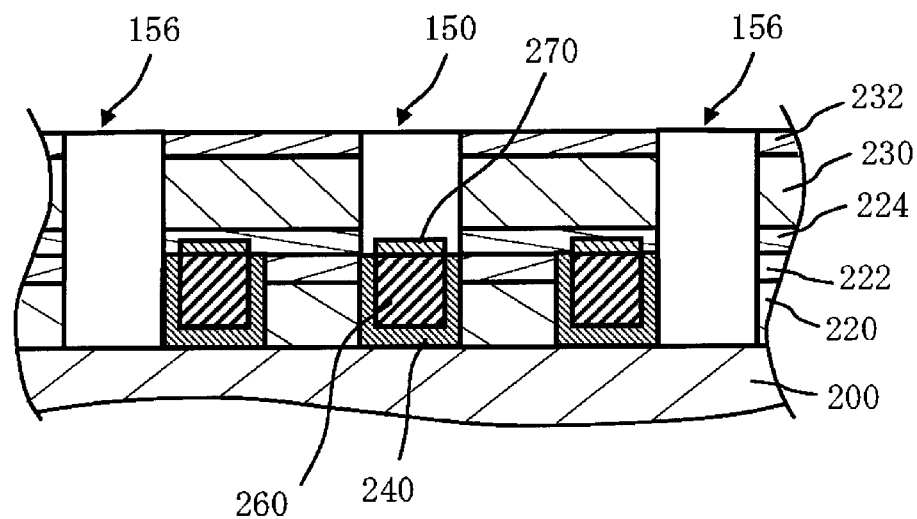
FIGS. 12A and 12B are process cross-sectional views showing the processes to be executed according to the flowchart in FIG. 11.
Figure 12B:
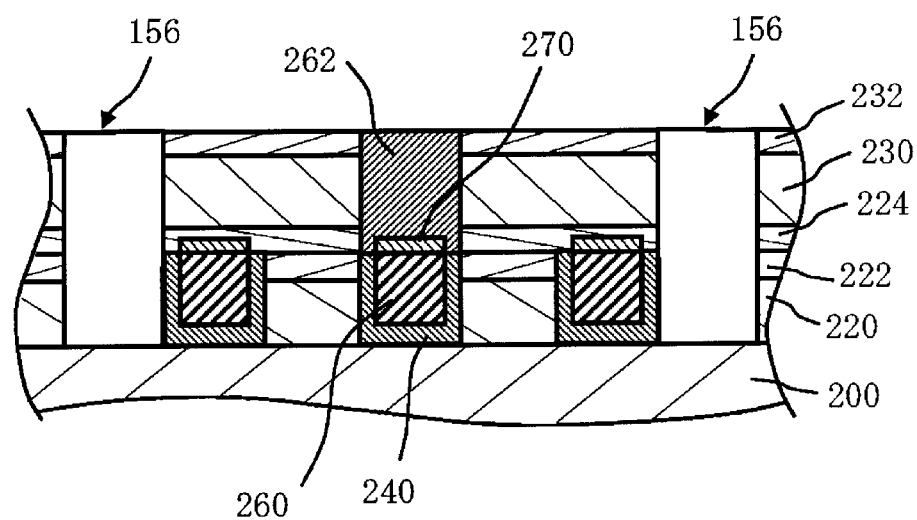

FIGS. 12A and 12B are process cross-sectional views showing the processes to be executed according to the flowchart in FIG. 11.

FIGS. 12A and 12B show the processes from the forming via hole (S113) to the forming via contact selectively (S116).

As shown in FIG. 12A, the multiple holes 150 and 156 that penetrate from the SiOC film 232 serving as the cap film to a bottom surface of the lower-layer wiring layer are formed by lithography and etching processes as the via hole opening step. Specifically, the insulating film 220 is pitted until reaching the surface of the substrate 200. Here, although the SiC film 224 is formed on the upper surface of the lower-layer wiring layer, it is possible to omit the SiC film 224 in the third embodiment because the via holes are formed until reaching the surface of the substrate 200. Moreover, when there is no problem in light of the strength of the insulating film 220 when performing the CMP or the like, it is also possible to omit formation of the SiOC film 222. As described above, in addition to the hole 150 for forming the via contact, the holes 152 are also formed in positions not supposed to form any via contacts to reach the lower-layer wiring layer. Other features are similar to the first embodiment. Then, as shown in FIG. 12B, the via contact film 262 is selectively formed as similar to the first embodiment.

Figure 13A:
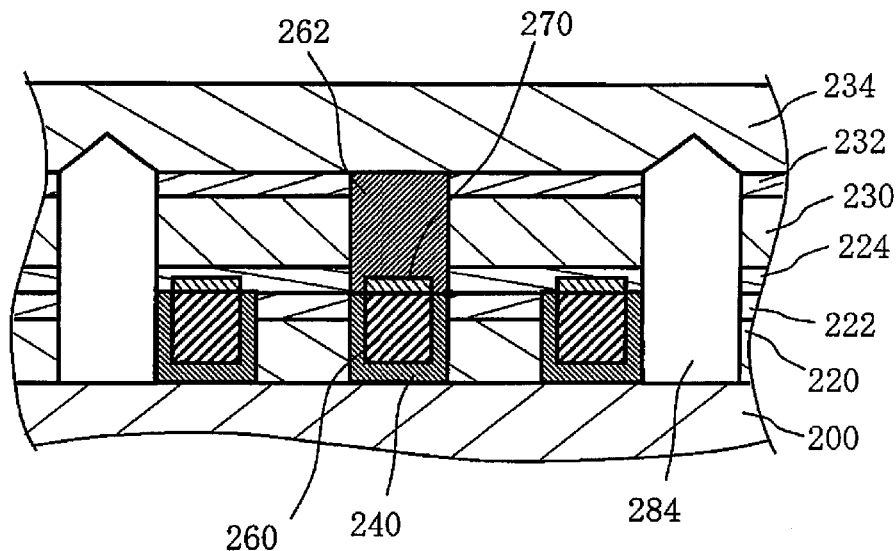
FIGS. 13A and 13B are process cross-sectional views showing the processes to be executed according to the flowchart in FIG. 11.
Figure 13B:
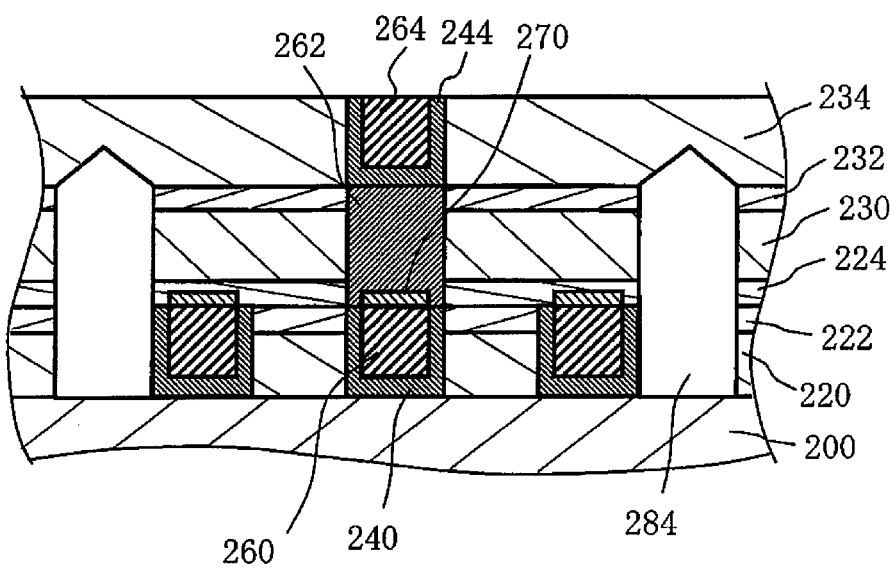

FIGS. 13A and 13B are process cross-sectional views showing the processes to be executed according to the flowchart in FIG. 11.

FIGS. 13A and 13B show the processes from forming insulating film (S120) to forming upper-layer wiring (S122).

As shown in FIG. 13A, in the insulating film forming step, the insulating film 234 is formed by the CVD method similarly to the first embodiment after forming the via contact film 262. By using the CVD method, it is possible to form the insulating film 234 to close the tops of the remaining holes 156 in which the via contact film 262 is not formed so as to cover the holes 156. In this way, it is possible to form a wider air gap 284 spreading into the lower-layer wiring after occluding the holes 156.

As shown in FIG. 13B, in the upper-layer wiring forming step, it is possible to form the Cu film 264 on the insulating film 234 by use of the damascene method similarly to the lower-layer wiring. Here, the barrier metal film 244 is formed on the wall surfaces and the bottom surface of the Cu film 264.

Figure 14:
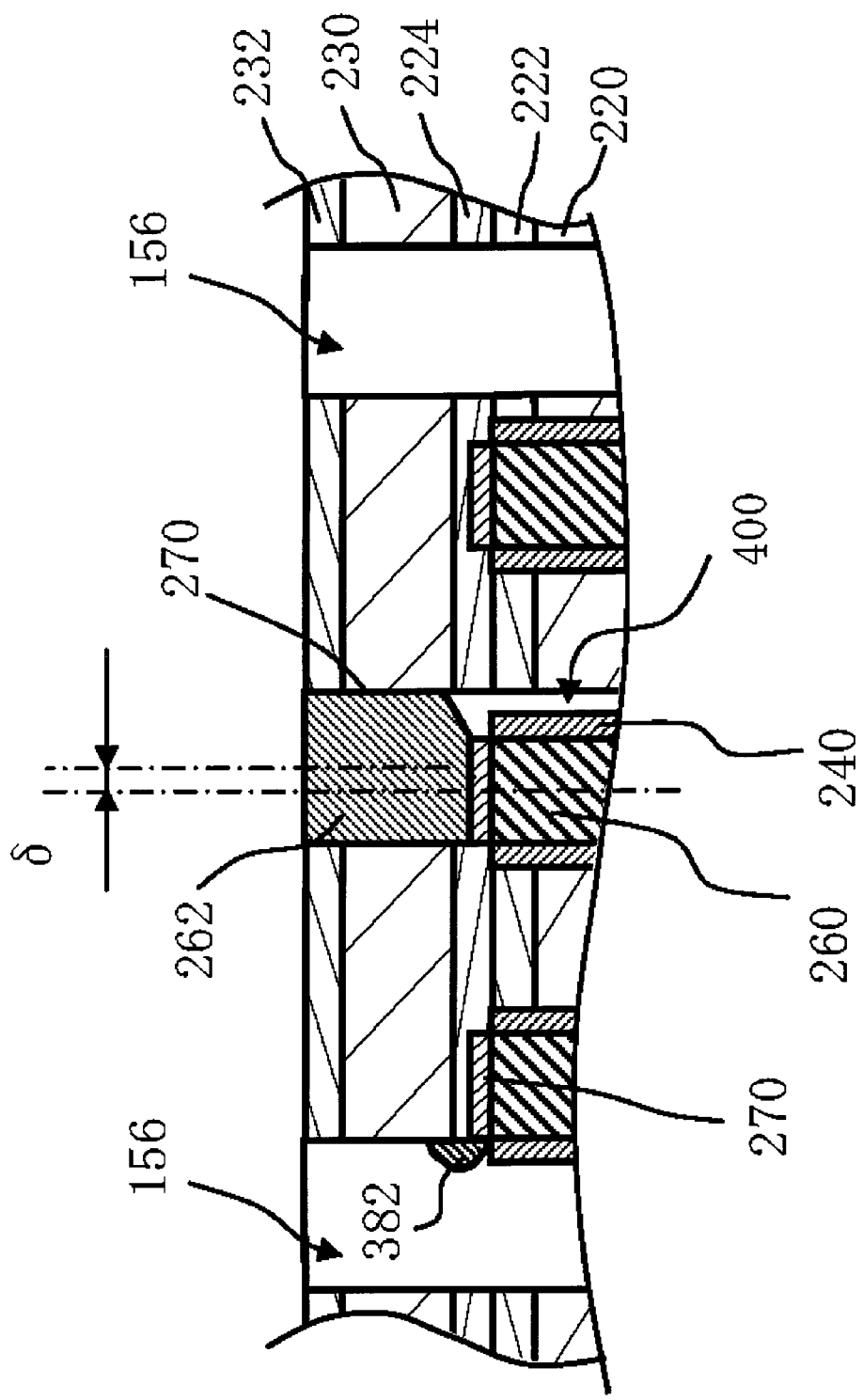
FIG. 14 is a cross-sectional view showing an example of misalignment occurred in the third embodiment.

FIG. 14 is a cross-sectional view showing an example of misalignment occurred in the third embodiment.

As shown in FIG. 14, if the position of the hole 150 for forming the via contact is displaced by a dimension (distance) 6, the insulating film 220 adjacent to the lower-layer wiring is also etched by such displacement and a hollow is formed as a consequence. However, either the carbon nanotubes or the metal deposited by the selective plating method serving as the via contact film 262 grow only at the portion where the metal wiring is provided below. Further, Cu has higher selectivity than the material of the barrier metal layer 240. Therefore, the via contact film 262 does not grow on a side surface of the barrier metal film 240. Accordingly, the via contact film 262 does not enter the hollow 400 on the lower-layer wiring side. Therefore, an insulation failure of the lower-layer wiring hardly occurs in the event of displacement. Meanwhile, the holes 156 for the air gaps are also displaced because the holes are formed by the light exposure together with the hole 150 for forming the via contact. However, if the Cu film 206 is partially uncovered, the uncovered area is limited. Accordingly, when the hole 150 is completely buried with the via contact film 262 growing therein, the material of the via contact does not grow very much and only a small conductive film 382 is formed inside the hole 156 as shown in FIG. 14. This point is similar to the explanation with reference to FIG. 7. Therefore, such an allowance for misalignment is effective for refining the multilayer wiring.

As described above, it is also preferable to continue etching to a portion between the wires of the lower-layer wiring so as to form the air gap that extends to the portion between the wires. In this configuration, it is possible to form a larger air gap than the case where the air gap is formed only in the via layer. Therefore, it is possible to reduce the capacity even more effectively.

Fourth Embodiment

A fourth embodiment is explained with reference to FIGS. 15 and 16.

A method of providing air gaps in addition to the holes 156 by combining the second embodiment and the third embodiment will be described in a fourth embodiment.

Figure 15:
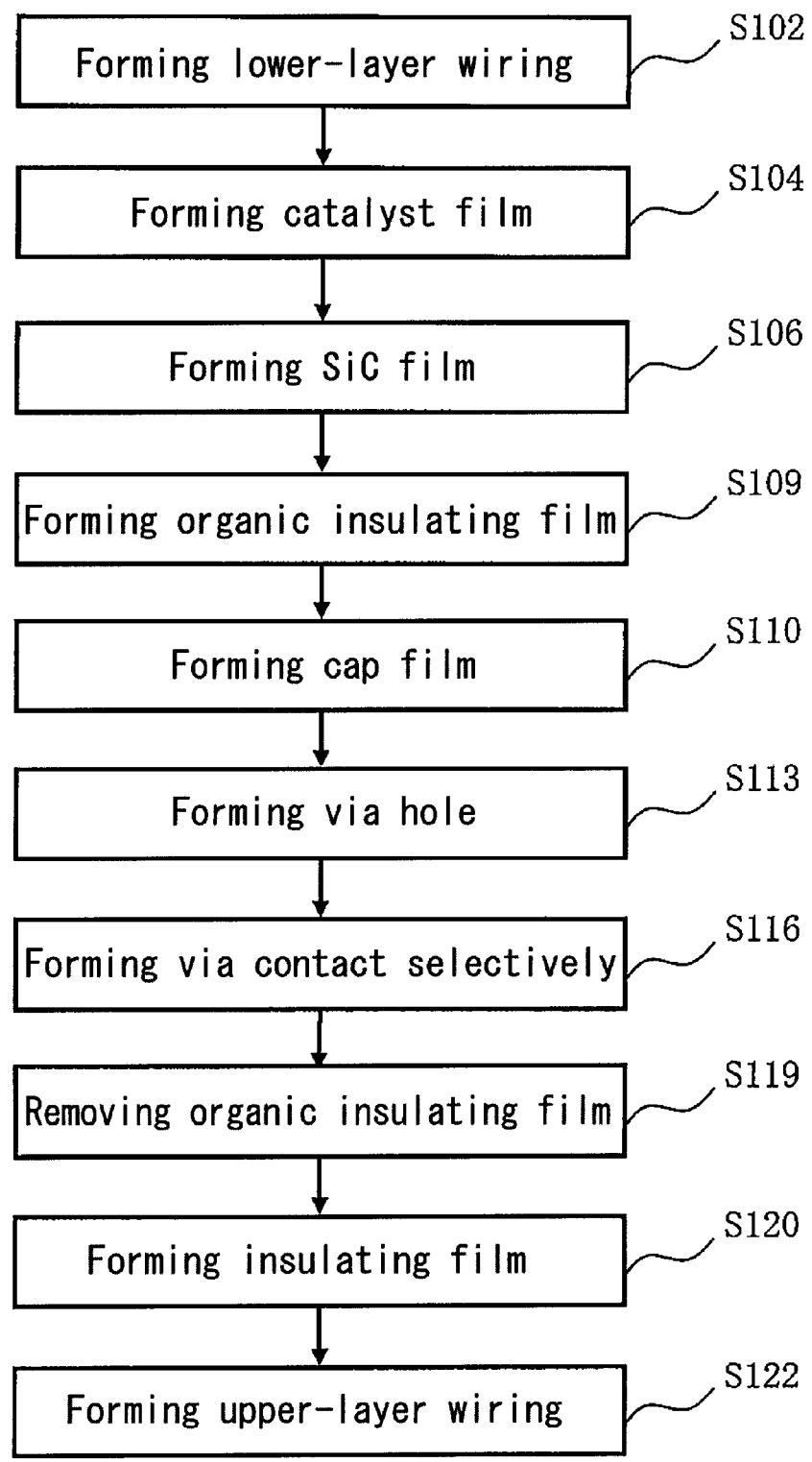
FIG. 15 is a flowchart showing a method of manufacturing a semiconductor device according to the fourth embodiment.

FIG. 15 is a flowchart showing a method of manufacturing a semiconductor device according to the fourth embodiment.

As shown in FIG. 15, the method of manufacturing a semiconductor device according to the fourth embodiment is similar to FIG. 11 except that forming organic insulating film (S109) is executed instead of the forming insulating film (S108) and that removing organic insulating film (S119) is inserted between the forming via contact selectively (S116) and the forming insulating film (S120). Accordingly, the processes from the lower-layer wiring forming step (S102) to the SiC film forming step (S106) are the same as the third embodiment.

In the fourth embodiment, an organic film such as PAr is used for the insulating film 220 of the lower-layer wiring layer shown in FIG. 2A.

In FIG. 2D, the insulating film 230 constituting the interlayer insulating film for the via layer is formed on the SiC film 224 as the organic insulating film forming step similarly to the second embodiment. An organic film such as PAr is used for the insulating film 230 similarly to the second embodiment. Then, the processes from the cap film forming step (S110) to the selective via contact forming step (S116) are executed similarly to the third embodiment.

Figure 16A:
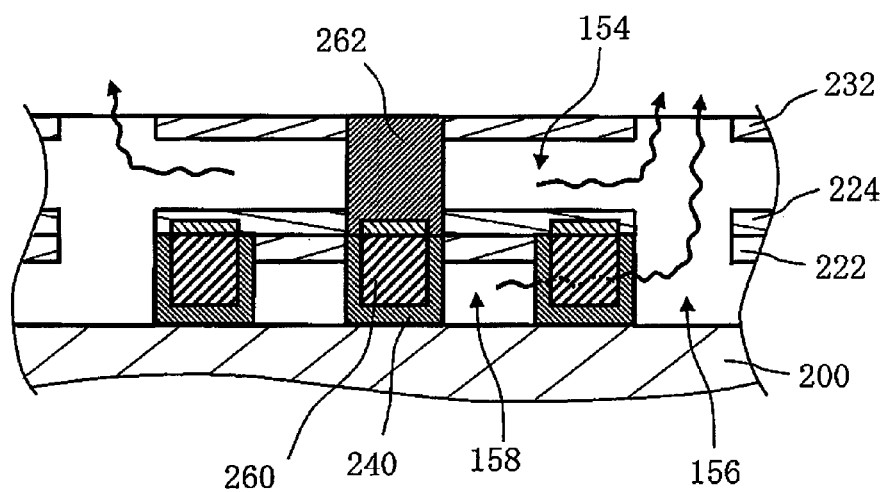
FIGS. 16A to 16C are process cross-sectional views showing the processes to be executed according to the flowchart in FIG. 15.
Figure 16B:
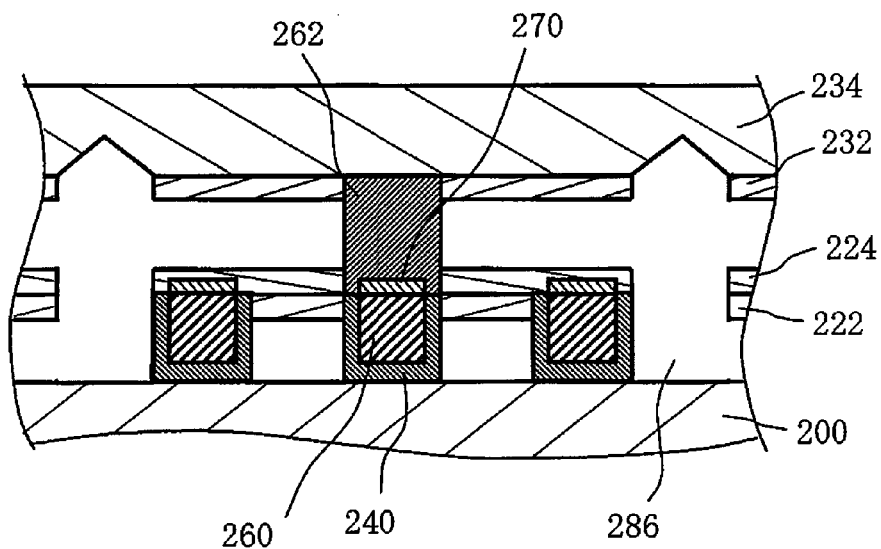
Figure 16C:
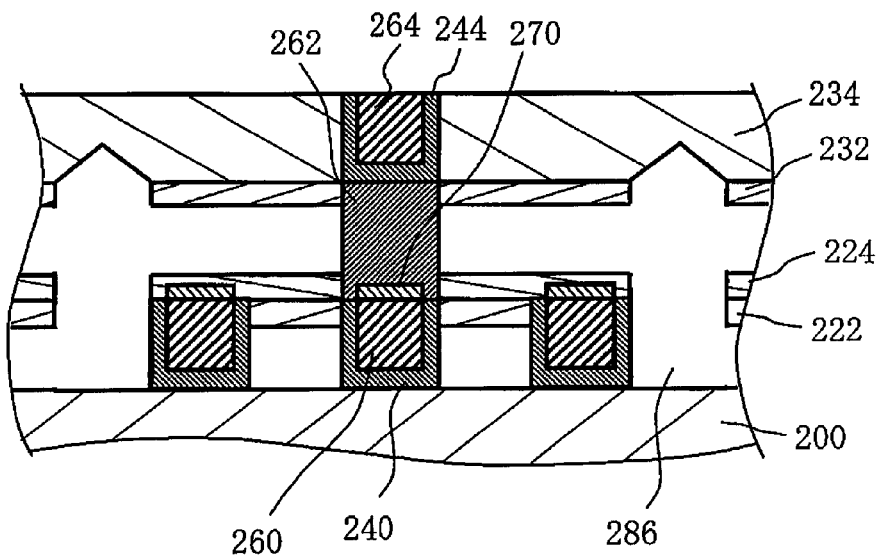

FIGS. 16A to 16C are process cross-sectional views showing the processes to be executed according to the flowchart in FIG. 15.

FIGS. 16A to 16C show the processes from removing organic insulating film (S119) to forming upper-layer wiring layer (S122).

As shown in FIG. 16A, in the organic insulating film removing step, both of the insulating film 230 of the via layer and the insulating film 220 of the lower-layer wiring layer are removed through the holes 156 by exposing the semiconductor device to the NH3 plasma atmosphere. In this way, the hollow space 154 is formed in the via layer including a portion below the SiOC film 232 serving as the cap film. Moreover, a hollow space 158 is formed in the lower-layer wiring layer including a portion below the SiOC film 222 serving as the cap film. Here, as described above, it is also preferable to expose the semiconductor device to oxygen ($O_2$) plasma atmosphere or nitrogen/hydrogen ($N_2/H_2$) plasma instead of NH3 plasma. Here it is only necessary to employ the atmosphere that can remove the insulating film 230 and the insulating film 220 constituting sacrificial films.

Then, in the insulating film forming step, the insulating film 234 is formed by the CVD method similarly to the first embodiment. In this way, it is possible to close the tops of the holes 156 so as to cover the holes 156. As a result, as shown in FIG. 16B, it is possible to form an air gap 286 which is even wider than the air gap in the third embodiment. Then, by forming the upper-layer wiring similarly to the third embodiment, it is possible to form a multilayer wiring structure including the Cu film 264 as a upper-layer wiring as shown in FIG. 16C. Here, the barrier metal film 244 is formed on the wall surfaces and the bottom surface of the Cu film 264.

In the fourth embodiment, the SiOC film 232 constituting the cap film is formed on the via layer. Therefore, the SiOC film 232 functions as a protective film and maintains a mechanical strength even the space is provided below the SiOC film 232, similarly to the second embodiment. Moreover, the SiOC film 222 constituting the cap film is also formed on the lower-layer wiring layer. Therefore, the SiOC film 222 functions as a protective film and maintains a mechanical strength even the space is provided below the SiOC film 222. Meanwhile, in addition to SiOC, it is also possible to use at least one insulating material selected from the group consisting of SiC, SiCH, SiCN, SiOCH, and $SiO_2$ as the material of the cap films on the via layer as well as the lower-layer wiring layer. Moreover, it is also possible to use other films as long as such films are not removed by plasma. Moreover, instead of an insulating film formed by the CVD method, it is also possible to use an insulating film formed by a coating method as long as such a film is not removed by plasma. For example, it is possible to use polymethylsiloxane. Other features are similar to the second embodiment.

As describe above, it is possible to further reduce the wiring capacity even lower than any of the aforementioned first to third embodiments by removing the entire insulating film 230 in the via layer and the entire insulating film 220 in the lower-layer wiring layer.

In the above description, the air gaps are formed simultaneously in two layers, namely, the lower-layer wiring layer and the via layer. However, the number of layers is not limited only to two. It is also possible to form more air gaps simultaneously after forming the multilayer structure.

Here, in addition to Cu, it is also possible to use other materials mainly containing Cu which are typically used in the semiconductor industry such as a Cu—Sn alloy, a Cu—Ti alloy, a Cu—Al alloy or the like as the material of the wiring layers in the respective embodiments in order to obtain similar effects.

The embodiments of the present invention have been described based on certain specific examples. However, it is to be understood that the present invention will not be limited only to those specific examples.

Moreover, it is also possible to select and use appropriate parameters such as the film thickness of the interlayer insulating film, the size, the shape or the number of the opening as deemed necessary for implementing various semiconductor integrated circuits and semiconductor elements.

In addition, all semiconductor devices and methods of manufacturing such semiconductor devices employing the gist of the present invention as well as any modifications and design changes which are made possible by those skilled in the art from the teaching of the present invention shall be deemed to be encompassed by the scope of the present invention.

Although methods and processes which are normally used in the semiconductor industry, such as photolithography processes or cleaning processes after the respective processes are omitted for the sake of brevity in this specification. However, it is needless to say that the present invention also encompasses such conventional processes as appropriate.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A method for manufacturing a semiconductor device, comprising:
    forming a first wiring in a first insulating layer on a base member;
    forming a second insulating layer on the first insulating layer;
    forming a first hole in the second insulating layer so as to reach the first wiring in the first insulating layer and a second hole in the second insulating layer so as to reach the first insulating layer;
    forming a via contact in the first hole; and
    forming a third insulating layer above the second insulating layer so as to shut the second hole with an air gap in the second hole, said air gap provided in the same level of the via contact and not provided in the same level of the first wiring layer.

2. A method for manufacturing a semiconductor device of claim 1, wherein the first hole is formed so as to reach a top surface of the first wiring.

3. A method for manufacturing a semiconductor device of claim 2, further comprising, forming a catalyst film on the top surface of the first wiring.

4. A method for manufacturing a semiconductor device of claim 3, wherein the via contact is carbon nanotube.

5. A method for manufacturing a semiconductor device of claim 1, wherein the first hole has substantially same width as the second hole.

6. A method for manufacturing a semiconductor device of claim 1, further comprising forming a cap insulating layer on the second insulating layer after forming the second insulating layer, and wherein the first hole and the second hole are provided in the second insulating layer and the cap insulating layer.

7. A method for manufacturing a semiconductor device of claim 6, further comprising removing the second insulating layer before forming the third insulating layer.

8. A method for manufacturing a semiconductor device of claim 7, wherein the first hole is formed so as to reach a top surface of the first wiring.

9. A method for manufacturing a semiconductor device of claim 8, further comprising, forming a catalyst film on the top surface of the first wiring.

10. A method for manufacturing a semiconductor device of claim 9, wherein the via contact is carbon nanotube.

11. A method for manufacturing a semiconductor device of claim 7, wherein the first hole has substantially same width as the second hole.

* * * * *